(12) United States Patent
Chen et al.

(10) Patent No.: US 11,699,990 B2
(45) Date of Patent: Jul. 11, 2023

(54) OSCILLATING DEVICE

(71) Applicant: TXC CORPORATION, Taipei (TW)

(72) Inventors: Yu-Liang Chen, Ping Cheng (TW);
Chih-Hsun Chen, Ping Cheng (TW);
Wan-Lin Hsieh, Ping Cheng (TW);
Erh-Shuo Hsu, Ping Cheng (TW);
Sheng-Hsiang Kao, Ping Cheng (TW)

(73) Assignee: TXC CORPORATION, Taipei (TW)

( * ) Notice: Subject to any disclaimer, the term of this patent is extended or adjusted under 35 U.S.C. 154(b) by 0 days.

(21) Appl. No.: 17/897,909

(22) Filed: Aug. 29, 2022

(65) Prior Publication Data
US 2023/0018805 A1    Jan. 19, 2023

Related U.S. Application Data

(63) Continuation-in-part of application No. 17/379,500, filed on Jul. 19, 2021, now Pat. No. 11,469,738.

(51) Int. Cl.
*H03H 9/19* (2006.01)
*H03H 9/02* (2006.01)
*G01P 15/097* (2006.01)
*H03H 9/125* (2006.01)

(52) U.S. Cl.
CPC ............. *H03H 9/19* (2013.01); *G01P 15/097* (2013.01); *H03H 9/02551* (2013.01); *H03H 9/02834* (2013.01); *H03H 9/125* (2013.01)

(58) Field of Classification Search
CPC ........................................................ H03H 9/19
USPC ........................................................ 331/158
See application file for complete search history.

(56) References Cited

U.S. PATENT DOCUMENTS

| | | | |
|---|---|---|---|
| 4,344,010 A | 8/1982 | Vig et al. | |
| 4,409,711 A | 10/1983 | Ballato et al. | |
| 4,575,690 A | 3/1986 | Walls et al. | |
| 5,442,146 A | 8/1995 | Bell et al. | |
| 5,512,864 A | 4/1996 | Vig | |
| 6,819,194 B2 | 11/2004 | Toncich et al. | |
| 8,188,800 B2 | 5/2012 | Fry et al. | |
| 8,446,222 B2 | 5/2013 | Brenndorfer | |
| 9,837,958 B2 | 12/2017 | Chen et al. | |
| 2005/0275480 A1* | 12/2005 | Nishio | H03B 5/326 331/158 |
| 2006/0132248 A1 | 6/2006 | Lichter et al. | |
| 2011/0169583 A1 | 7/2011 | Hardy et al. | |

(Continued)

*Primary Examiner* — Joseph Chang
(74) *Attorney, Agent, or Firm* — Birch, Stewart, Kolasch & Birch, LLP

(57) ABSTRACT

An oscillating device includes a first quartz crystal resonator, a driving circuit, a first waveform adjustment circuit, and at least two second quartz crystal resonators. The first quartz crystal resonator has a first resonant frequency. The driving circuit, coupled to the first quartz crystal resonator, drives the first quartz crystal resonator to generate a first oscillating signal having the first resonant frequency. The second quartz crystal resonators, coupled in parallel and coupled to the driving circuit and the first quartz crystal resonator, have a second resonant frequency and receive and rectify the first oscillating signal to generate a second oscillating signal having the second resonant frequency. The first waveform adjustment circuit, coupled to the second quartz crystal resonators, receives the second oscillating signal and adjusts the second oscillating signal to generate a first waveform adjustment signal.

15 Claims, 7 Drawing Sheets

(56) References Cited

U.S. PATENT DOCUMENTS

| | | | |
|---|---|---|---|
| 2012/0039153 A1* | 2/2012 | Kobayashi | G04R 20/10 331/158 |
| 2017/0179772 A1 | 6/2017 | Asanuma et al. | |
| 2018/0088160 A1 | 3/2018 | Maki et al. | |
| 2018/0091158 A1 | 3/2018 | Sudo et al. | |
| 2021/0091748 A1 | 3/2021 | Kubena et al. | |

* cited by examiner

OSCILLATING DEVICE

CROSS-REFERENCE TO RELATED APPLICATION

This application is a Continuation in Part of co-pending application Ser. No. 17/379,500, filed on 19 Jul. 2021, for which priority is claimed under 35 U.S.C. § 120 and the entire contents of all of which are hereby incorporated by reference.

BACKGROUND OF THE INVENTION

Field of the Invention

The present invention relates to an oscillating device, particularly to an oscillating device with reduced acceleration sensitivity and phase noise.

Description of the Related Art

Electronic devices often include an oscillator to provide an oscillating signal for use as a clock source. The oscillating signal can be controlled by a resonator which requires some form of excitation signal to sustain oscillations.

The operation of an oscillator, controlled by the resonator, may be affected by age and certain environmental conditions such as temperature and, of particular interest here, acceleration. When an oscillator is subjected to acceleration, the frequency of the oscillating signal it produces may be altered. The change in frequency is proportional to the magnitude of the acceleration and dependent on direction, giving rise to an acceleration sensitivity vector. A time variable acceleration, for example vibration, can cause frequency modulation of the oscillator's frequency. Reducing the sensitivity of such oscillators to alterations of frequency due to acceleration is therefore desirable in order to produce a stable and pure frequency output from an oscillator.

To overcome the abovementioned problems, the present invention provides an oscillating device, so as to solve the afore-mentioned problems of the prior art.

SUMMARY OF THE INVENTION

The present invention provides an oscillating device, which reduces acceleration sensitivity and phase noise.

In an embodiment of the present invention, an oscillating device includes a first quartz crystal resonator, a driving circuit, at least two second quartz crystal resonators, and a first waveform adjustment circuit. The first quartz crystal resonator has a first resonant frequency. The driving circuit is coupled to the first quartz crystal resonator. The driving circuit is configured to drive the first quartz crystal resonator to generate a first oscillating signal having the first resonant frequency. The second quartz crystal resonators are coupled in parallel and coupled to the driving circuit and the first quartz crystal resonator. The second quartz crystal resonators have a second resonant frequency. The second quartz crystal resonators are configured to receive and rectify the first oscillating signal to generate a second oscillating signal having the second resonant frequency. The first waveform adjustment circuit is coupled to the at least two second quartz crystal resonators and configured to receive the second oscillating signal. The first waveform adjustment circuit is configured to adjust the second oscillating signal to generate a first waveform adjustment signal.

In an embodiment of the present invention, the first waveform adjustment circuit is configured to adjust at least one of a waveform swing and a direct-current (DC) level of the second oscillating signal to generate the first waveform adjustment signal.

In an embodiment of the present invention, the first waveform adjustment signal is a clock signal. The first waveform adjustment circuit is configured to isolate from a load variation behind the first quartz crystal resonator, the driving circuit, and the at least two second quartz crystal resonators to generate the clock signal in response to the second oscillating signal.

In an embodiment of the present invention, the first waveform adjustment circuit is coupled to the driving circuit and the first quartz crystal resonator and configured to receive and adjust the first oscillating signal to generate a second waveform adjustment signal. The second quartz crystal resonators are configured to receive and rectify the second waveform adjustment signal to generate the second oscillating signal.

In an embodiment of the present invention, the first waveform adjustment circuit is configured to adjust at least one of a waveform swing and a direct-current (DC) level of the first oscillating signal to generate the second waveform adjustment signal.

In an embodiment of the present invention, the second waveform adjustment signal is a clock signal. The first waveform adjustment circuit is configured to isolate from a load variation behind the first quartz crystal resonator and the driving circuit to generate the clock signal in response to the first oscillating signal.

In an embodiment of the present invention, the driving circuit and the first waveform adjustment circuit are integrated into an integrated circuit (IC). The IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the oscillating device further includes a second waveform adjustment circuit coupled to the first quartz crystal resonator, the driving circuit, and the second quartz crystal resonators. The second waveform adjustment circuit is configured to receive and adjust the first oscillating signal to generate a second waveform adjustment signal. The second quartz crystal resonators are configured to receive and rectify the second waveform adjustment signal to generate the second oscillating signal.

In an embodiment of the present invention, the second waveform adjustment circuit is configured to adjust at least one of a waveform swing and a direct-current (DC) level of the first oscillating signal to generate the second waveform adjustment signal.

In an embodiment of the present invention, the second waveform adjustment signal is a clock signal. The second waveform adjustment circuit is configured to isolate from a load variation behind the first quartz crystal resonator and the driving circuit to generate the clock signal in response to the first oscillating signal.

In an embodiment of the present invention, the driving circuit and the first waveform adjustment circuit are integrated into an integrated circuit (IC). The IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the driving circuit and the second waveform adjustment circuit are integrated into an integrated circuit (IC). The IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the driving circuit, the first waveform adjustment circuit, and the second waveform adjustment circuit are integrated into an integrated circuit (IC). The IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

In an embodiment of the present invention, the oscillating device further includes an electric switch with an end thereof coupled to the second adjustment circuit and another end of the electric switch is coupled to the at least two second quartz crystal resonators or an output terminal.

In an embodiment of the present invention, the driving circuit, the first waveform adjustment circuit, the electric switch, and the second waveform adjustment circuit are integrated into an integrated circuit (IC). The IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

To sum up, the oscillating device generates the oscillating signal with at least two quartz crystal resonators in parallel, thereby reducing acceleration sensitivity and phase noise.

DETAILED DESCRIPTION OF THE INVENTION

Figure 1:
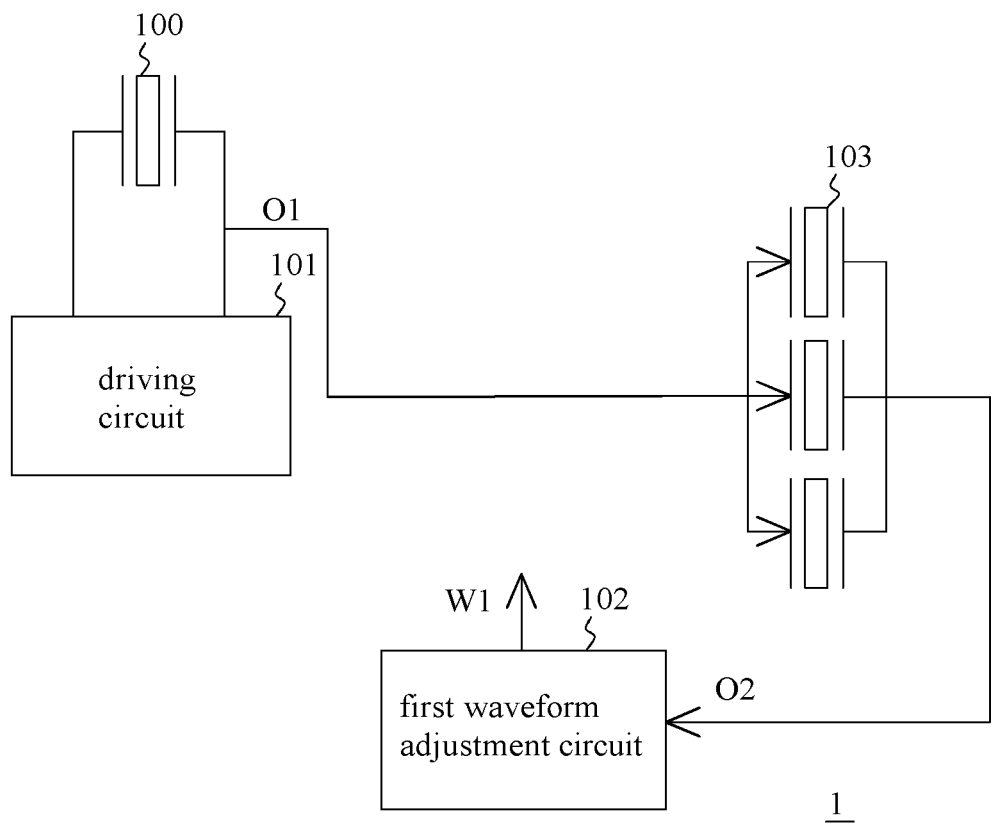
FIG. 1 is a diagram schematically illustrating an oscillating device according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, an oscillating device will be provided. The oscillating device generates an oscillating signal with at least two quartz crystal resonators in parallel, thereby reducing acceleration sensitivity and phase noise.

FIG. 1 is a diagram schematically illustrating an oscillating device according to a first embodiment of the present invention. Referring to FIG. 1, the oscillating device 1 includes a first quartz crystal resonator 100, a driving circuit 101, a first waveform adjustment circuit 102, and at least two second quartz crystal resonators 103. The first quartz crystal resonator 100 has a first resonant frequency. The second quartz crystal resonators 103 have a second resonant frequency. The first resonant frequency may be different from the second resonant frequency. Preferably, the second resonant frequency is the harmonic of the first resonant frequency. For example, the first resonant frequency is 500 MHz and the second resonant frequency is 1000, 1500, or 2000 MHz. The second resonant frequency may be the average value of the resonant frequency of all the second quartz crystal resonators 103. For example, the resonant frequency of each the second quartz crystal resonator 103 may be A+B or A−B MHz. A represents the second resonant frequency and B has a range of 50~100 ppm. Alternatively, the first quartz crystal resonator 100 and the second quartz crystal resonator 103 have the same resonant frequency without using any feedback circuit. The driving circuit 101 is coupled to the first quartz crystal resonator 100. The second quartz crystal resonators 103 are coupled in parallel and coupled to the driving circuit 101 and the first quartz crystal resonator 100. The first waveform adjustment circuit 102 is coupled to the second quartz crystal resonators 103. The first embodiment exemplifies three second quartz crystal resonators 103.

In the operation of the oscillating device 1, the driving circuit 101 drives the first quartz crystal resonator 100 to generate a first oscillating signal O1 having the first resonant frequency. The second quartz crystal resonators 103 receive and rectify the first oscillating signal O1 to generate a second oscillating signal O2 having the second resonant frequency. The bandwidth of the second quartz crystal resonators 103 connected in parallel may be expanded. The first waveform adjustment circuit 102 receives the second oscillating signal O2. The first waveform adjustment circuit 102 adjusts the second oscillating signal O2 to generate a first waveform adjustment signal W1. For example, the first waveform adjustment circuit 102 adjusts at least one of a waveform swing and a direct-current (DC) level of the second oscillating signal O2 to generate the first waveform adjustment signal W1, but the present invention is not limited thereto. In some embodiments, the first waveform adjustment signal W1 may be a first clock signal. The first waveform adjustment circuit 102 may isolate from a load variation behind the first quartz crystal resonator 100, the driving circuit 101, and the second quartz crystal resonators 103 to generate the first clock signal in response to the second oscillating signal O2.

Figure 2:
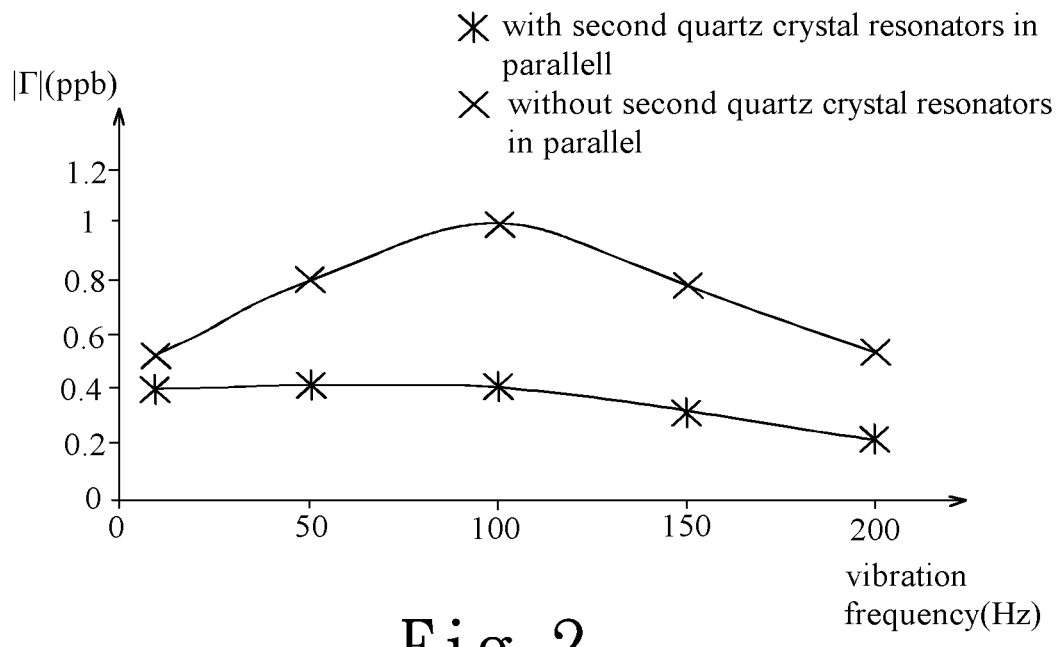
FIG. 2 is a diagram schematically illustrating curves of acceleration sensitivity versus vibration frequency according to an embodiment of the present invention.
Figure 3:
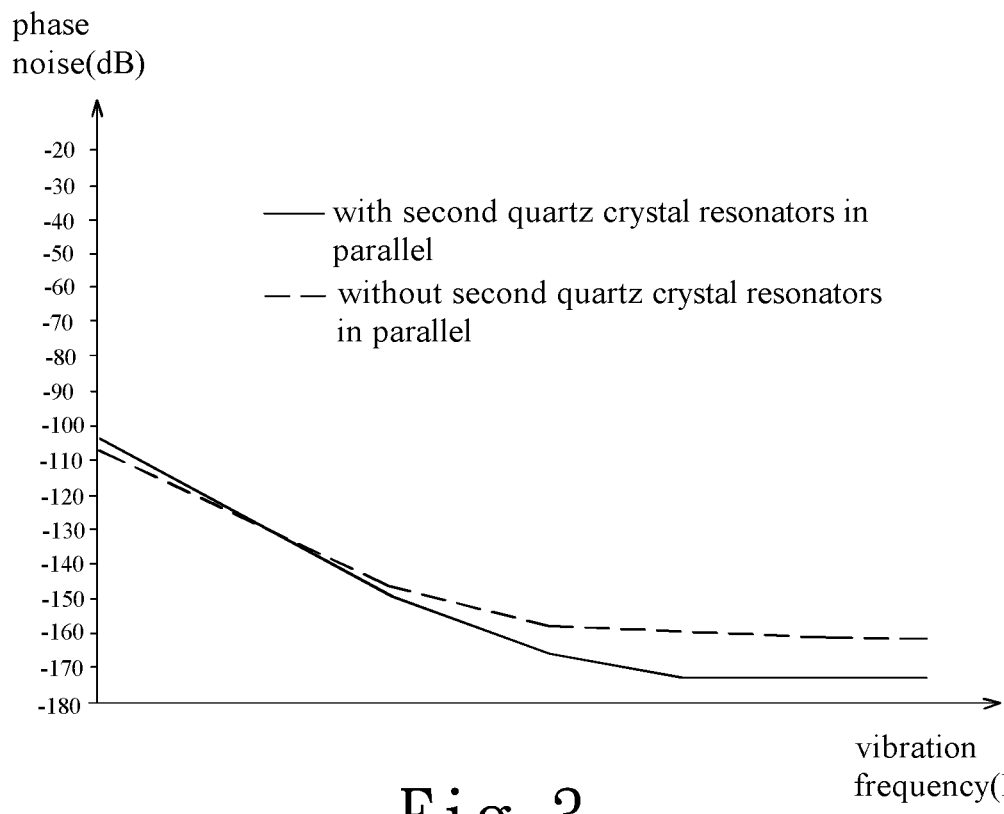
FIG. 3 is a diagram schematically illustrating curves of phase noise versus vibration frequency according to an embodiment of the present invention.

FIG. 2 is a diagram schematically illustrating curves of acceleration sensitivity versus vibration frequency according to an embodiment of the present invention. FIG. 3 is a diagram schematically illustrating curves of phase noise versus vibration frequency according to an embodiment of the present invention. Referring to FIG. 1, FIG. 2, and FIG. 3, parameters in FIG. 2 and FIG. 3 are defined in equations (1) and (2).

$$|\Gamma| = \sqrt{\Gamma_x^2 + \Gamma_y^2 + \Gamma_z^2} \quad (1)$$

$$\Gamma_i = \frac{2 f_v \times 10^{\left(\frac{I_i(f_v)}{20}\right)}}{a_i \times v_o} \quad (2)$$

i represents the position of the oscillating device 1. $\Gamma_i$ represents the acceleration sensitivity of i. $\Gamma_x$ represents the acceleration sensitivity of $\Gamma_i$ in the x direction. $\Gamma_y$ represents the acceleration sensitivity of F, in the y direction. $\Gamma_z$ represents the acceleration sensitivity of F, in the z direction. $f_v$ represents the vibration frequency of the oscillating device 1. $I_i(f_v)$ represents a power ratio at the vibration frequency. $a_i$ represents the acceleration of i. $v_o$ represents the frequency of the second oscillating signal O2. As illustrated in FIG. 1, FIG. 2, and FIG. 3, the acceleration sensitivity and the phase noise of the oscillating device 1 with the second quartz crystal resonators 103 in parallel are respectively lower than the acceleration sensitivity and the phase noise of the oscillating device without the second quartz crystal resonators in parallel.

Figure 4:
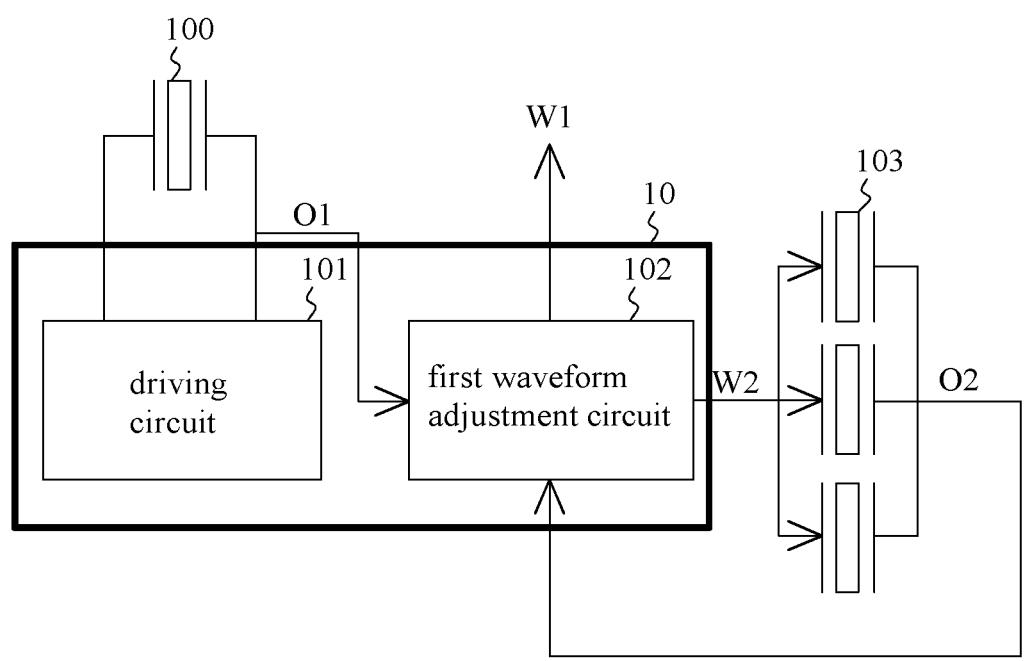
FIG. 4 is a diagram schematically illustrating an oscillating device according to a second embodiment of the present invention.

FIG. 4 is a diagram schematically illustrating an oscillating device according to a second embodiment of the present invention. Referring to FIG. 1 and FIG. 4, the first waveform adjustment circuit 102 is coupled to the driving circuit 101 and the first quartz crystal resonator 100. The first waveform adjustment circuit 102 receives and adjusts the first oscillating signal O1 to generate a second waveform adjustment signal W2. For example, the first waveform adjustment circuit 102 may adjust at least one of a waveform swing and a direct-current (DC) level of the first oscillating signal O1 to generate the second waveform adjustment signal W2, but the present invention is not limited thereto. In some embodiments, the second waveform adjustment signal W2 may be a second clock signal. The first waveform adjustment circuit 102 may isolate from a load variation behind the first quartz crystal resonator 100 and the driving circuit 101 to generate the second clock signal in response to the first oscillating signal O1. The second quartz crystal resonators 103 receive and rectify the second waveform adjustment signal W2 to generate the second oscillating signal O2. In addition, the driving circuit 101 and the first waveform adjustment circuit 102 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 5:
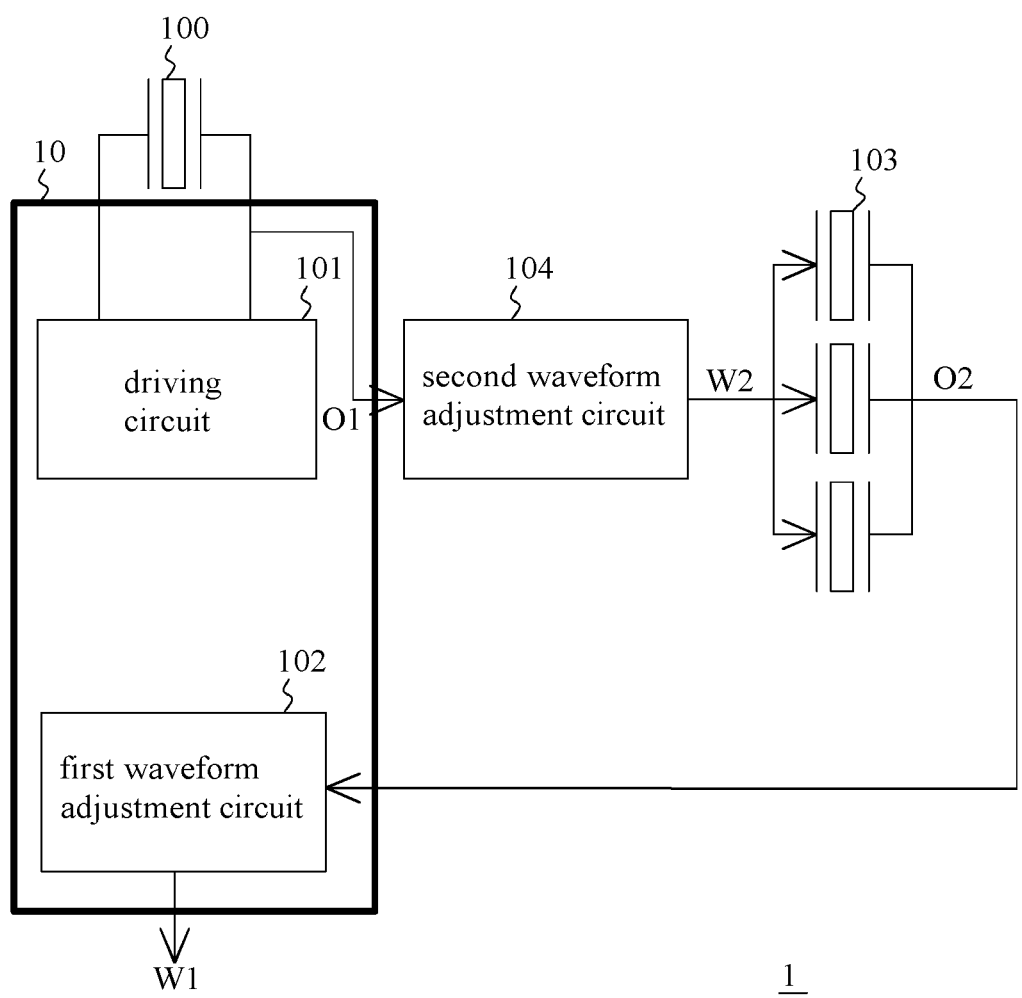
FIG. 5 is a diagram schematically illustrating an oscillating device according to a third embodiment of the present invention.

FIG. 5 is a diagram schematically illustrating an oscillating device according to a third embodiment of the present invention. Referring to FIG. 1 and FIG. 5, the oscillating device 1 further includes a second waveform adjustment circuit 104 coupled to the first quartz crystal resonator 100, the driving circuit 101, and the second quartz crystal resonators 103. The second waveform adjustment circuit 104 receives and adjusts the first oscillating signal O1 to generate a second waveform adjustment signal W2. For example, the second waveform adjustment circuit 104 adjusts at least one of a waveform swing and a direct-current (DC) level of the first oscillating signal O1 to generate the second waveform adjustment signal W2, but the present invention is not limited thereto. In some embodiments, the second waveform adjustment signal W2 may be a second clock signal. The second waveform adjustment circuit 104 may isolate from a load variation behind the first quartz crystal resonator 100 and the driving circuit 101 to generate the second clock signal in response to the first oscillating signal O1. The second quartz crystal resonators 103 receive and rectify the second waveform adjustment signal W2 to generate the second oscillating signal O2. In addition, the driving circuit 101 and the first waveform adjustment circuit 102 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 6:
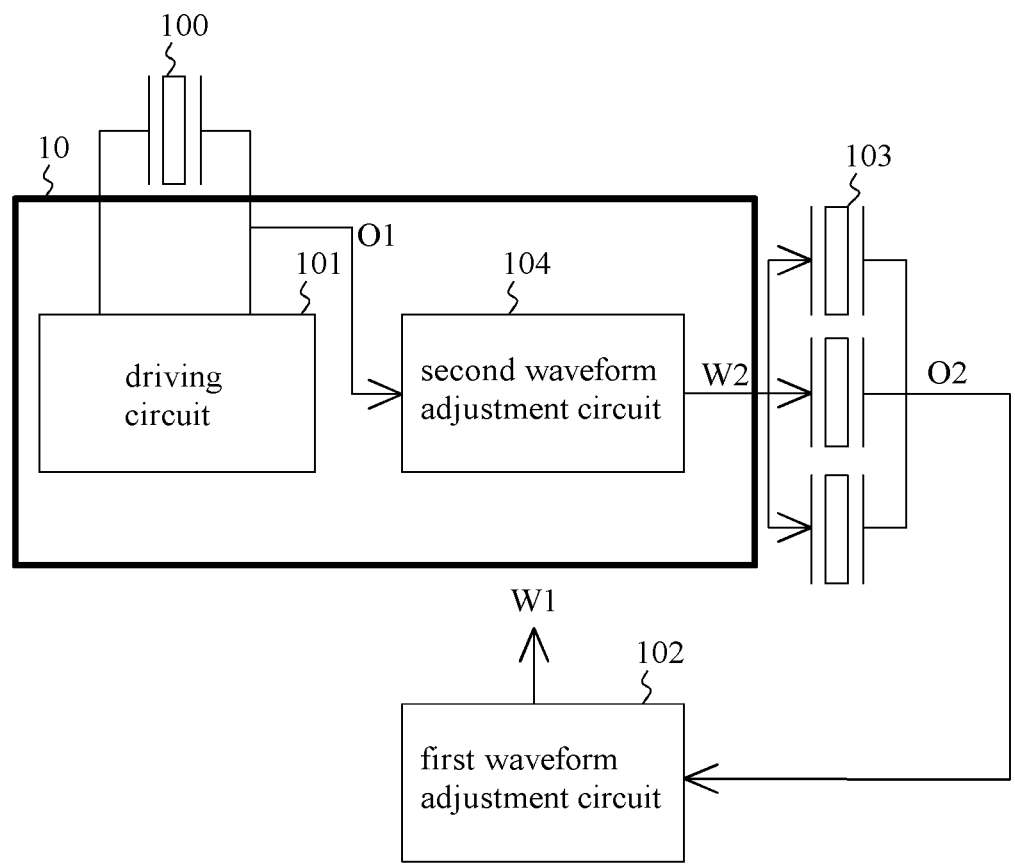
FIG. 6 is a diagram schematically illustrating an oscillating device according to a fourth embodiment of the present invention.

FIG. 6 is a diagram schematically illustrating an oscillating device according to a fourth embodiment of the present invention. Referring to FIG. 5 and FIG. 6, the driving circuit 101 and the second waveform adjustment circuit 104 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 7:
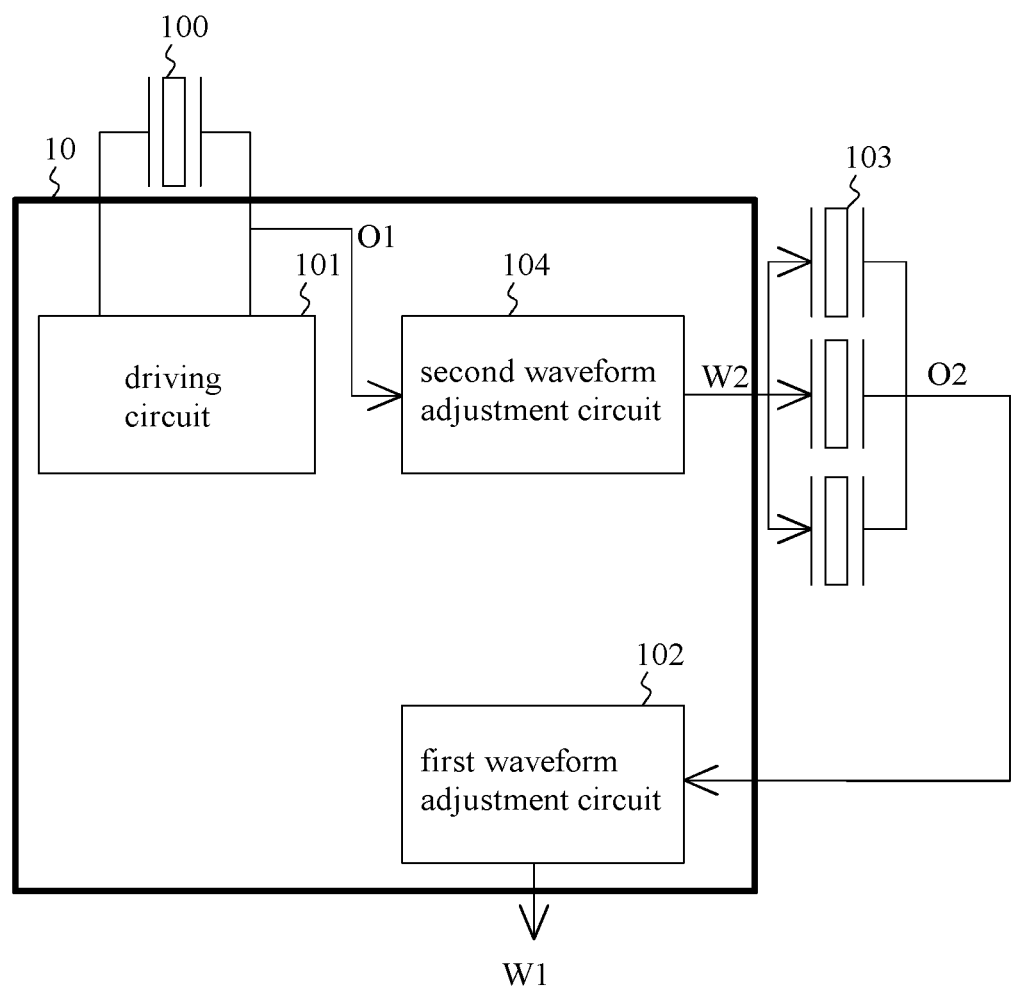
FIG. 7 is a diagram schematically illustrating an oscillating device according to a fifth embodiment of the present invention.

FIG. 7 is a diagram schematically illustrating an oscillating device according to a fifth embodiment of the present invention. Referring to FIG. 6 and FIG. 7, the driving circuit 101, the first waveform adjustment circuit 102, and the second waveform adjustment circuit 104 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

Figure 8:
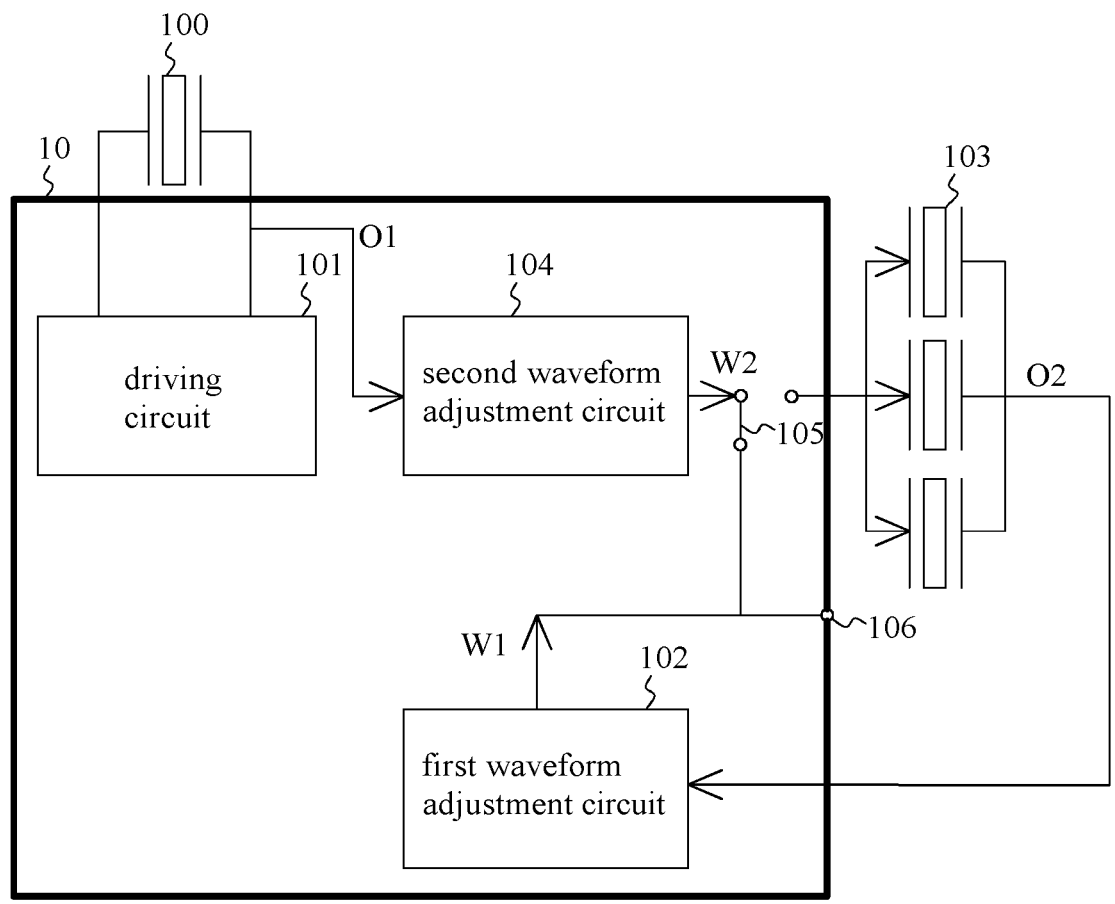
FIG. 8 is a diagram schematically illustrating an oscillating device according to a sixth embodiment of the present invention.

FIG. 8 is a diagram schematically illustrating an oscillating device according to a sixth embodiment of the present invention. Referring to FIG. 7 and FIG. 8, the sixth embodiment is different from the fifth embodiment in the sixth embodiment further includes an electric switch 105 with an end thereof coupled to the second waveform adjustment circuit 104. Another end of the electric switch 105 is coupled to the second quartz crystal resonators 103 or an output terminal 106. The first waveform adjustment circuit 102 is coupled to the output terminal 106. When the electric switch 105 connects the second waveform adjustment circuit 104 to the second quartz crystal resonators 103 and disconnects the second waveform adjustment circuit 104 from the output terminal 106, the second quartz crystal resonators 103 receives the second waveform adjustment signal W2 through the electric switch 105 such that the first waveform adjustment circuit 102 generates the first waveform adjustment signal W1 received by the output terminal 106. When the electric switch 105 disconnects the second waveform adjustment circuit 104 from the second quartz crystal resonators 103 and connects the second waveform adjustment circuit 104 to the output terminal 106, the second waveform adjustment circuit 104 transmits the second waveform adjustment signal W2 to the output terminal 106 through the electric switch 105.

In addition, the driving circuit 101, the first waveform adjustment circuit 102, the electric switch 105, and the second waveform adjustment circuit 104 may be integrated into an integrated circuit (IC) 10. The IC 10 and the first quartz crystal resonator 100 are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO), but the present invention is not limited thereto.

According to the embodiments provided above, the oscillating device generate an clear oscillating signal with at least two quartz crystal resonators in parallel, thereby reducing acceleration sensitivity and phase noise.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An oscillating device comprising:
   a first quartz crystal resonator having a first resonant frequency;
   a driving circuit coupled to the first quartz crystal resonator, wherein the driving circuit is configured to drive the first quartz crystal resonator to generate a first oscillating signal having the first resonant frequency;
   at least two second quartz crystal resonators coupled in parallel and coupled to the driving circuit and the first quartz crystal resonator, wherein the at least two second quartz crystal resonators has a second resonant frequency, and the at least two second quartz crystal resonators are configured to receive and rectify the first oscillating signal to generate a second oscillating signal having the second resonant frequency; and
   a first waveform adjustment circuit coupled to the at least two second quartz crystal resonators and configured to receive the second oscillating signal, wherein the first waveform adjustment circuit is configured to adjust the second oscillating signal to generate a first waveform adjustment signal.

2. The oscillating device according to claim 1, wherein the first waveform adjustment circuit is configured to adjust at least one of a waveform swing and a direct-current (DC) level of the second oscillating signal to generate the first waveform adjustment signal.

3. The oscillating device according to claim 1, wherein the first waveform adjustment signal is a clock signal, and the first waveform adjustment circuit is configured to isolate from a load variation behind the first quartz crystal resonator, the driving circuit, and the at least two second quartz crystal resonators to generate the clock signal in response to the second oscillating signal.

4. The oscillating device according to claim 1, wherein the first waveform adjustment circuit is coupled to the driving circuit and the first quartz crystal resonator and configured to receive and adjust the first oscillating signal to generate a second waveform adjustment signal, and the at least two second quartz crystal resonators are configured to receive and rectify the second waveform adjustment signal to generate the second oscillating signal.

5. The oscillating device according to claim 4, wherein the first waveform adjustment circuit is configured to adjust at least one of a waveform swing and a direct-current (DC) level of the first oscillating signal to generate the second waveform adjustment signal.

6. The oscillating device according to claim 4, wherein the second waveform adjustment signal is a clock signal, and the first waveform adjustment circuit is configured to isolate from a load variation behind the first quartz crystal resonator and the driving circuit to generate the clock signal in response to the first oscillating signal.

7. The oscillating device according to claim 4, wherein the driving circuit and the first waveform adjustment circuit are integrated into an integrated circuit (IC), and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

8. The oscillating device according to claim 1, further comprising a second waveform adjustment circuit coupled to the first quartz crystal resonator, the driving circuit, and the at least two second quartz crystal resonators, wherein the second waveform adjustment circuit is configured to receive and adjust the first oscillating signal to generate a second waveform adjustment signal, and the at least two second quartz crystal resonators are configured to receive and rectify the second waveform adjustment signal to generate the second oscillating signal.

9. The oscillating device according to claim 8, wherein the second waveform adjustment circuit is configured to adjust at least one of a waveform swing and a direct-current (DC) level of the first oscillating signal to generate the second waveform adjustment signal.

10. The oscillating device according to claim 8, wherein the second waveform adjustment signal is a clock signal, and the second waveform adjustment circuit is configured to isolate from a load variation behind the first quartz crystal resonator and the driving circuit to generate the clock signal in response to the first oscillating signal.

11. The oscillating device according to claim 8, wherein the driving circuit and the first waveform adjustment circuit are integrated into an integrated circuit (IC), and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

12. The oscillating device according to claim 8, wherein the driving circuit and the second waveform adjustment circuit are integrated into an integrated circuit (IC), and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

13. The oscillating device according to claim 8, wherein the driving circuit, the first waveform adjustment circuit, and the second waveform adjustment circuit are integrated into an integrated circuit (IC), and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

14. The oscillating device according to claim 8, further comprising an electric switch with an end thereof coupled to the second adjustment circuit and another end of the electric switch is coupled to the at least two second quartz crystal resonators or an output terminal.

15. The oscillating device according to claim 14, wherein the driving circuit, the first waveform adjustment circuit, the electric switch, and the second waveform adjustment circuit are integrated into an integrated circuit (IC), and the IC and the first quartz crystal resonator are coupled into a crystal oscillator (XO), a Temperature Compensated Crystal Oscillator (TCXO), a Voltage Controlled Crystal Oscillator (VCXO), an Oven Controlled Crystal Oscillator (OCXO), a Voltage Controlled Temperature Compensated Crystal Oscillator (VCTCXO), or a Voltage Controlled Oven Controlled Crystal Oscillator (VCOCXO).

* * * * *